(12) United States Patent
Yun et al.

(10) Patent No.: US 10,523,253 B2
(45) Date of Patent: Dec. 31, 2019

(54) GLASS SUBSTRATE INCLUDING PASSIVE-ON-GLASS DEVICE AND SEMICONDUCTOR DIE

(71) Applicant: QUALCOMM Incorporated, San Diego, CA (US)

(72) Inventors: Changhan Yun, San Diego, CA (US); Chengjie Zuo, San Diego, CA (US); Mario Velez, San Diego, CA (US); Niranjan Sunil Mudakatte, San Diego, CA (US); Shiqun Gu, San Diego, CA (US); Jonghae Kim, San Diego, CA (US); David Berdy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/029,432

(22) Filed: Jul. 6, 2018

(65) Prior Publication Data
US 2018/0316374 A1  Nov. 1, 2018

Related U.S. Application Data

(62) Division of application No. 15/216,615, filed on Jul. 21, 2016, now Pat. No. 10,044,390.

(51) Int. Cl.
*H04B 1/16* (2006.01)
*H01L 21/48* (2006.01)
(Continued)

(52) U.S. Cl.
CPC ......... *H04B 1/1638* (2013.01); *H01L 21/486* (2013.01); *H01L 21/4853* (2013.01); *H01L 23/49827* (2013.01); *H01L 23/49838* (2013.01); *H01L 23/5223* (2013.01); *H01L 23/64* (2013.01); *H01L 23/66* (2013.01); *H01L 24/19* (2013.01); *H01L 24/20* (2013.01); *H01L 27/01* (2013.01); *H01L 28/10* (2013.01); *H01L 28/40* (2013.01); *H04B 1/006* (2013.01); *H05K 1/165* (2013.01); *H05K 1/185* (2013.01);
(Continued)

(58) Field of Classification Search
CPC ......... H01L 27/01; H01L 49/02; H01L 23/28; H04B 1/16; H04B 1/40
See application file for complete search history.

(56) References Cited

U.S. PATENT DOCUMENTS 9,379,685 B2  6/2016  Motoki et al.
9,472,859 B2  10/2016 Dang et al.
(Continued)

FOREIGN PATENT DOCUMENTS

EP  1154481 A2  11/2001
EP  2916354 A2   9/2015

OTHER PUBLICATIONS

International Search Report and Written Opinion—PCT/US2017/038363—ISA/EPO—dated Nov. 15, 2017.
(Continued)

*Primary Examiner* — Blane J Jackson
(74) *Attorney, Agent, or Firm* — Moore IP/Qualcomm

(57) ABSTRACT

In an illustrative example, an apparatus includes a passive-on-glass (POG) device integrated within a glass substrate. The apparatus further includes a semiconductor die integrated within the glass substrate.

20 Claims, 7 Drawing Sheets

(51) Int. Cl.
*H01L 23/522* (2006.01)
*H01L 23/64* (2006.01)
*H01L 23/00* (2006.01)
*H04B 1/00* (2006.01)
*H05K 1/16* (2006.01)
*H05K 1/18* (2006.01)
*H05K 3/46* (2006.01)
*H01L 23/498* (2006.01)
*H01L 23/66* (2006.01)
*H01L 27/01* (2006.01)
*H01L 49/02* (2006.01)
*H01F 17/00* (2006.01)

(52) U.S. Cl.
CPC ....... *H05K 3/4605* (2013.01); *H01F 17/0013* (2013.01); *H01L 2223/6616* (2013.01); *H01L 2223/6672* (2013.01); *H01L 2223/6677* (2013.01); *H01L 2223/6688* (2013.01); *H01L 2224/04105* (2013.01); *H01L 2224/24195* (2013.01); *H01L 2924/10253* (2013.01); *H01L 2924/13091* (2013.01); *H01L 2924/1421* (2013.01); *H01L 2924/15153* (2013.01); *H01L 2924/19041* (2013.01); *H01L 2924/19042* (2013.01); *H01L 2924/19105* (2013.01); *H05K 2201/097* (2013.01); *H05K 2201/0959* (2013.01); *H05K 2201/09536* (2013.01); *H05K 2201/09827* (2013.01)

(56) References Cited

U.S. PATENT DOCUMENTS

| | | | |
|---|---|---|---|
| 9,767,957 B2* | 9/2017 | Liu | H01F 27/2804 |
| 10,044,390 B2* | 8/2018 | Yun | H01L 21/4853 |
| 10,256,850 B2 | 4/2019 | Wloczysiak | |
| 2007/0172340 A1 | 7/2007 | Curotto et al. | |
| 2009/0180239 A1 | 7/2009 | Oh | |
| 2013/0075860 A1* | 3/2013 | Kuo | H01F 5/003 257/531 |
| 2014/0035935 A1 | 2/2014 | Shenoy et al. | |
| 2014/0182897 A1 | 7/2014 | Lee et al. | |
| 2014/0240944 A1 | 8/2014 | Stenson et al. | |
| 2015/0201495 A1 | 7/2015 | Kim et al. | |
| 2015/0237732 A1 | 8/2015 | Velez et al. | |
| 2015/0271920 A1 | 9/2015 | Kim et al. | |
| 2015/0304059 A1 | 10/2015 | Zuo et al. | |
| 2016/0025932 A1 | 1/2016 | Shi et al. | |
| 2016/0100489 A1 | 4/2016 | Costa et al. | |
| 2016/0286656 A1 | 9/2016 | Cho et al. | |
| 2016/0316374 A1* | 10/2016 | Xu | H04W 16/14 |
| 2017/0026060 A1* | 1/2017 | Thompson | H04B 1/0057 |
| 2017/0033135 A1 | 2/2017 | Whitefield et al. | |
| 2018/0026666 A1* | 1/2018 | Yun | H01L 21/4853 455/188.1 |

OTHER PUBLICATIONS

Partial International Search Report—PCT/US2017/038363—ISA/EPO —dated Sep. 25, 2017.

* cited by examiner

GLASS SUBSTRATE INCLUDING PASSIVE-ON-GLASS DEVICE AND SEMICONDUCTOR DIE

I. CROSS-REFERENCE TO RELATED APPLICATIONS

This application is a divisional application of and claims the benefit of U.S. patent application Ser. No. 15/216,615, filed Jul. 21, 2016 and entitled "GLASS SUBSTRATE INCLUDING PASSIVE-ON-GLASS DEVICE AND SEMICONDUCTOR DIE," the contents of which are incorporated by reference in their entirety.

II. FIELD

The present disclosure is generally related to electronic devices and more particularly to electronic devices that include glass substrates.

III. DESCRIPTION OF RELATED ART

Electronic devices include mobile devices, servers, base stations, and other devices that enable storage, retrieval, and processing of information. As an illustrative example, a server may communicate with a computer or other device using a wired network, such as a local area network (LAN) or the Internet. As another example, a mobile device may use a wireless network to communicate data with a base station or other device. In some circumstances, data received by an electronic device may be subject to noise or interference, which may reduce signal quality of the data or which may cause the data to be retransmitted.

To improve quality of received signals, certain components of a mobile device may be formed on a glass substrate. For example, a circuit component may be formed on a glass substrate to "isolate" the component in order to reduce effects of noise from other components of the mobile device.

In some applications, a size of the glass substrate may limit a number or size of components that may be formed on the glass substrate. For example, in order to comply with a revision of a particular wireless communication protocol, the number or size of the components may be increased. Increasing a size of the glass substrate to accommodate the increased size or number of components may cause the glass substrate to deviate from a design specification, such as if the glass substrate becomes too large to be included in the mobile device.

IV. SUMMARY

A device in accordance with the disclosure may include a passive-on-glass (POG) device and a semiconductor die that are "relocated" from a surface of a glass substrate to an interior of the glass substrate. By integrating the POG device and the semiconductor die inside the glass substrate, circuitry attached to the surface of the glass substrate may be reduced or eliminated, which may enable reduced thickness of a device. For example, a molding material used to enclose the circuitry may also be reduced or eliminated. As another example, use of one or more materials used to adhere the circuitry to the surface of the glass substrate may be reduced or eliminated.

In an illustrative implementation, the POG device includes a triplexer (TPX) circuit, and the semiconductor die includes a set of switches. The TPX circuit may be configured to receive a radio frequency (RF) signal from an antenna and to generate a set of output signals based on the received signal, such as a high-band signal, a middle-band signal, and a low-band signal. The set of switches may be configured to select among the set of output signals. For example, the set of switches may be configured to select two of the output signals to enable a duplexing carrier aggregation mode. As another example, the set of switches may be configured to select three of the output signals to enable a tripling carrier aggregation mode. Switching between the set of output signals may enable components of the mobile device to be used with multiple wireless communication protocols, such as in wireless networks that use triplexing carrier aggregation as well as wireless networks that use duplexing carrier aggregation or no carrier aggregation.

By integrating the TPX circuit within the glass substrate, an inductor included in the TPX circuit may have a three-dimensional (3D) configuration. The 3D inductor may have a greater quality factor (Q factor) as compared to a planar inductor formed on the surface of the glass substrate, yielding improved device performance in some applications. Further, in some implementations, the inductor has a "wrap-around" configuration that wraps around the semiconductor die, further increasing component density. In some cases, a number or size of components may be increased by integrating the components within the glass substrate as compared to forming the components on a surface of the substrate, such as by wrapping the 3D inductor around the semiconductor die.

In an illustrative example, an apparatus includes a passive-on-glass (POG) device integrated within a glass substrate. The apparatus further includes a semiconductor die integrated within the glass substrate.

In another illustrative example, a method of fabrication of a device includes forming a cavity in a glass substrate. The method further includes forming a passive device disposed at least partially within the cavity. The method also includes integrating a semiconductor die within the glass substrate.

In another illustrative example, a method of operation of a device includes receiving a signal at a multiband bandpass filter within a glass substrate. The method further includes generating a set of output signals by the multiband bandpass filter based on the signal. The method further includes selecting one or more output signals of the set of output signals using a set of switches included within the glass substrate.

In another illustrative example, an apparatus includes means for bandpass filtering a signal. The means for bandpass filtering is integrated within a glass substrate. The apparatus further includes means for selecting one or more output signals of a set of output signals generated by the means for bandpass filtering. The means for selecting is integrated within the glass substrate.

One particular advantage provided by at least one of the disclosed examples is reduced size of a device. For example, "relocating" a POG device and a semiconductor die to an interior of a glass substrate may enable reduction of material used to enclose or attach the POG device and the semiconductor die to a surface of the substrate. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
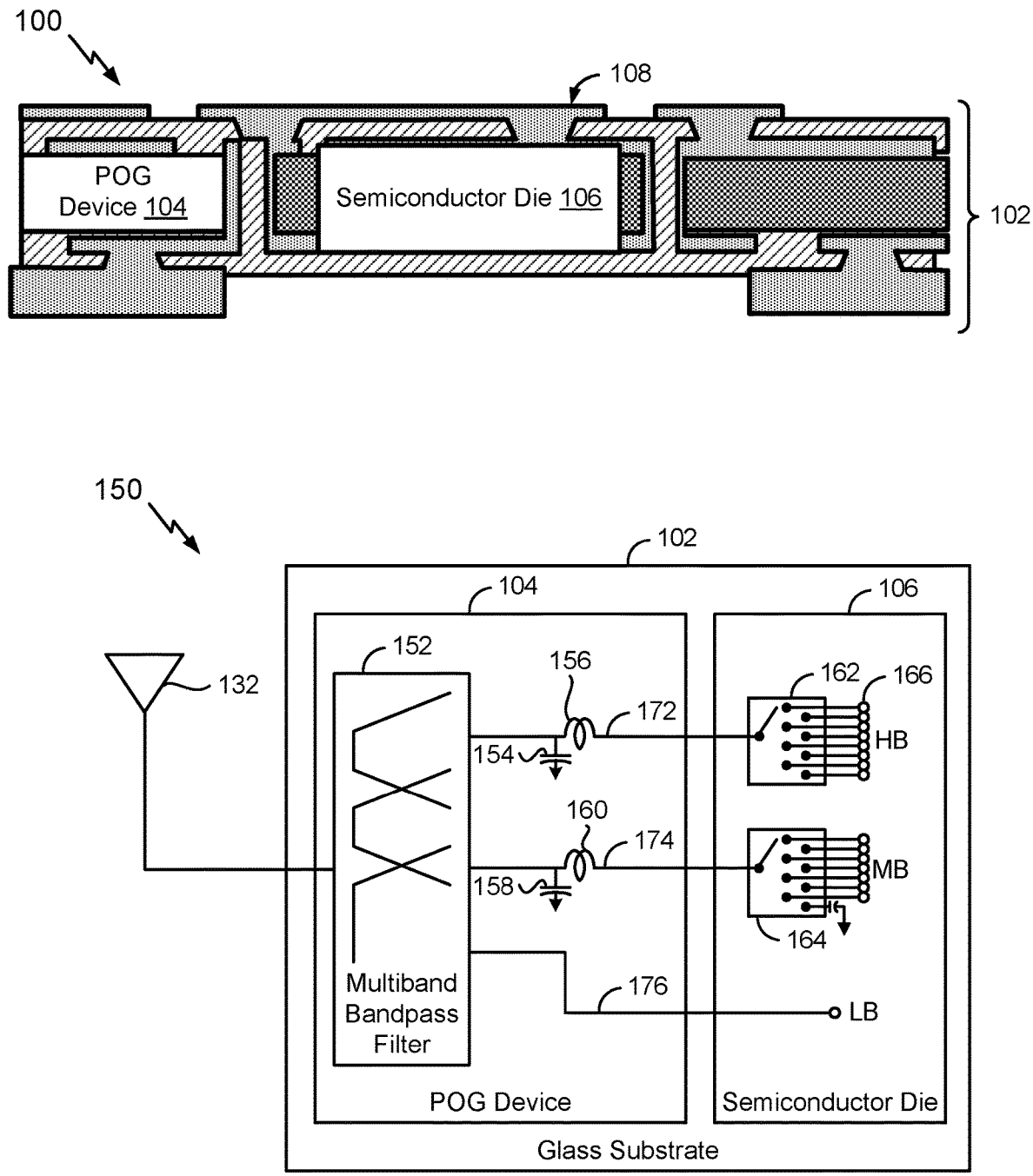
FIG. 1 illustrates a cross-sectional view of a glass substrate that includes a passive-on-glass (POG) device and a semiconductor die and further illustrates an example of a system that includes the glass substrate.

FIG. 1 illustrates a cross-sectional view 100 of a glass substrate 102.

Depending on the particular implementation, the glass substrate 102 may correspond to a substrate of a package configured to enclose an integrated circuit, a substrate of an interposer configured to connect integrated circuits or an integrated circuit and a printed circuit board (PCB), or a substrate of a hybrid integrated circuit (HIC), as illustrative examples.

The glass substrate 102 includes a passive-on-glass (POG) device 104. The POG device 104 is integrated within the glass substrate 102. The POG device 104 may include one or more passive components, such as one or more inductors, one or more capacitors, a filter circuit (e.g., a bandpass filter circuit), one or more other components, or a combination thereof.

The glass substrate 102 also includes a semiconductor die 106 (e.g., a silicon semiconductor die). The semiconductor die 106 is integrated within the glass substrate 102. The semiconductor die 106 may include one or more active components, such as one or more transistors. In an illustrative example, the semiconductor die 106 includes multiple switches each including a transistor. The semiconductor die 106 is coupled to the POG device 104. For example, an output of the POG device 104 may be coupled to an input of the semiconductor die 106 via one or more traces or wires, as an illustrative example.

In some examples, the POG device 104 and the semiconductor die 106 are "relocated" from a surface 108 of the glass substrate 102 (e.g., in connection with a first design of the glass substrate 102) to an interior of the glass substrate 102 (e.g., to create a second design of the glass substrate 102). As a result, circuitry attached to the surface 108 may be reduced or eliminated, enabling reduced thickness of the glass substrate 102. Further, a molding material used to enclose the circuitry may also be reduced or eliminated, further reducing thickness of the glass substrate 102.

To further illustrate, FIG. 1 also depicts an illustrative example of a circuit diagram of a system 150 that includes the glass substrate 102. The system 150 further includes an antenna 132 coupled to the POG device 104. For example, the antenna 132 may be coupled to an input of the POG device 104.

In the example of the system 150, the POG device 104 includes a multiband bandpass filter 152. The multiband bandpass filter 152 may include multiple bandpass filter circuits in accordance with a carrier aggregation technique. For example, the POG device 104 may include a triplexer (TPX) circuit, and the TPX circuit may include multiple bandpass filter circuits, such as a low-band filter circuit, a high-band filter circuit, and a middle-band filter circuit. The multiband bandpass filter 152 may be configured to operate in accordance with a carrier aggregation technique that selectively combines multiple channels (e.g., downlink channels). An input of the multiband bandpass filter 152 is coupled to the antenna 132. The POG device 104 includes multiple outputs, such as a first output 172, a second output 174, and a third output 176.

The POG device 104 may include one or more other components, such as one or more inductors, one or more capacitors, one or more other components, or a combination thereof. For example, the multiband bandpass filter 152 may be coupled to a capacitor 154 and to an inductor 156. As another example, the multiband bandpass filter 152 may be coupled to a capacitor 158 and to an inductor 160.

The semiconductor die 106 may include a plurality of switches. For example, the plurality of switches may include metal-oxide-semiconductor field-effect transistors (MOSFETs) formed within the semiconductor die 106. The plurality of switches may include a first set of one or more switches 162 coupled to the first output 172 and may further include a second set of one or more switches 164 coupled to the second output 174. The semiconductor die 106 may include one or more output terminals (e.g., an output terminal 166), such as a terminal of an input/output (I/O) interface of the semiconductor die 106.

During operation, the system 150 may receive a signal (e.g., a radio frequency (RF) signal) using the antenna 132. The antenna 132 may provide the signal to the POG device 104 (e.g., to the multiband bandpass filter 152). The signal may be received in accordance with a carrier aggregation technique (e.g., using multiple carriers of a wireless network).

The multiband bandpass filter 152 is configured to generate multiple signals based on the signal from the antenna 132. In an illustrative example, the POG device 104 is configured to generate a high-band (HB) signal at the first output 172, to generate a middle band (MB) signal at the second output 174, and to generate a low-band (LB) signal at the third output 176. The HB signal, the MB signal, and the LB signal may correspond to a signal sent by a transmitter in a wireless communication system using a carrier aggregation technique. In the illustrative example of FIG. 1, the third output 176 is not connected to a switch. In this case, the LB signal may correspond to signal that is utilized during operation within multiple wireless networks. In other implementations, the third output 176 may be coupled to one or more switches of the semiconductor die 106.

The semiconductor die 106 is configured to receive one or more signals from the POG device 104. For example, the first set of one or more switches 162 may be configured to receive the HB signal and to selectively enable or disable the HB signal. As another example, the second set of one or more switches 164 may be configured to receive the MB signal and to selectively enable or disable the MB signal. In an illustrative example, the first set of one or more switches 162 and the second set of one or more switches 164 are coupled to a controller or a processor that controls activation and deactivation of the first set of one or more switches 162 and the second set of one or more switches 164.

To further illustrate, in a first mode of operation (e.g., a non-aggregation mode), the LB signal may be output by the system 150. In this example, the sets of switches 162, 164 may be deactivated, such as by receiving a first control signal having a first value at the first set of one or more switches 162 and by receiving a second control signal having the first value at the second set of one or more switches 164. In a second mode of operation (e.g., a duplexing carrier aggregation mode), the LB signal and the HB signal may be output by the system 150. In this example, the first set of one or more switches 162 may be activated and the second set of one or more switches 164 may be deactivated, such as by receiving the first control signal having a second value at the first set of one or more switches 162 and by receiving the second control signal having the first value at the second set of one or more switches 164. In a third mode of operation (e.g., another duplexing carrier aggregation mode), the LB signal and the MB signal may be output by the system 150. In this example, the first set of one or more switches 162 may be deactivated and the second set of one or more switches 164 may be activated, such as by receiving the first control signal having the first value at the first set of one or more switches 162 and by receiving the second control signal having the second value at the second set of one or more switches 164. In a fourth mode of operation (e.g., a triplexing carrier aggregation mode), the LB signal, the HB signal, and the MB signal may be output by the system 150. In this example, the sets of switches 162, 164 may be activated, such as by receiving the first control signal having the second value at the first set of one or more switches 162 and by receiving the second control signal having the second value at the second set of one or more switches 164.

The semiconductor die 106 may provide one or more selected signals to another device. For example, the semiconductor die may provide one or more of the HB signal, the MB signal, and the LB signal to a particular device component, such as to a low noise amplifier (LNA) of a receiver device, as an illustrative example.

One or more aspects of FIG. 1 may reduce a size of a device. For example, by relocating the POG device 104 and the semiconductor die 106 from the surface 108 of the glass substrate 102 to an interior of the glass substrate 102, circuitry attached to the surface 108 may be reduced or eliminated, enabling reduced thickness of the glass substrate 102. Further, a molding material used to enclose the circuitry may also be reduced or eliminated, further reducing thickness of the glass substrate 102.

Further, one or more aspects of FIG. 1 may improve performance of a device. For example, in an illustrative implementation, "extra" thickness of the glass substrate 102 (as a result of removing the circuitry and/or the molding) may be allocated to a three-dimensional (3D) inductor formed in the POG device 104 within the glass substrate 102. The 3D inductor may have a greater quality factor (Q factor) as compared to a planar inductor, yielding improved device performance, as described further with reference to FIG. 2.

Figure 2:
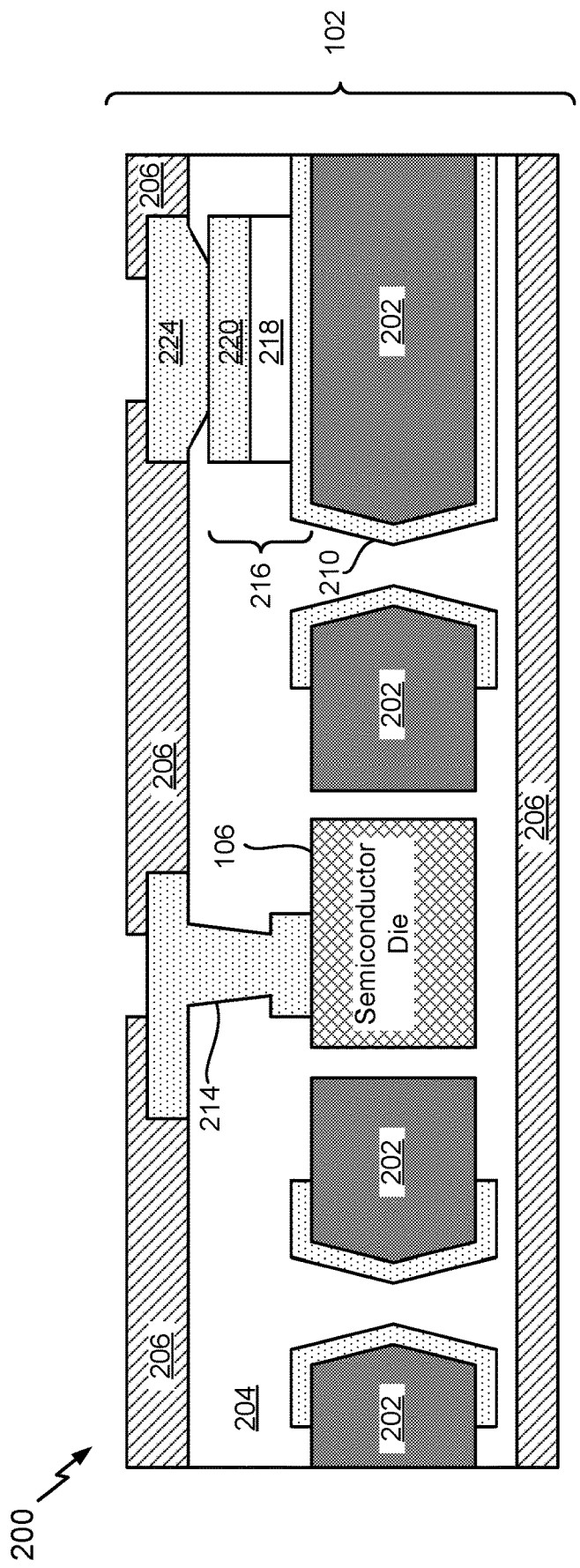
FIG. 2 illustrates a cross-sectional view of an illustrative example of the glass substrate of FIG. 1.

FIG. 2 depicts a cross section 200 of a first example of the glass substrate 102 of FIG. 1. In FIG. 2, the glass substrate 102 includes a glass material 202. Unshaded regions within the glass substrate 102 of FIG. 2 may indicate an organic material or a polymer material, such as a polymer material 204. The glass substrate 102 may further include a dielectric material 206.

The glass substrate 102 includes a conductive loop 210. In some implementations, the conductive loop 210 may include a through-glass via (TGV) or other structure. The conductive loop 210 may be included in a passive device, such as the POG device 104 of FIG. 1. In an illustrative example, the conductive loop is included in a capacitor, such as the capacitor 154 or the capacitor 158. In another example, the conductive loop 210 is included in a 3D inductor of the multiband bandpass filter 152 of FIG. 1. In another example, the conductive loop 210 may be included in the inductor 156, the inductor 160, or another inductor.

The glass substrate 102 may further include a TGV 214. In an illustrative example, the TGV 214 is coupled to an I/O interface of the semiconductor die 106. The TGV 214 may connect the semiconductor die 106 to one or more other components, such as to an LNA of a receiver device, as an illustrative example.

The glass substrate 102 may further include one or more capacitors, such as a metal-insulator-metal (MIM) capacitor 216. In some examples, the MIM capacitor 216 corresponds to the capacitor 154 or the capacitor 158. The MIM capacitor 216 may include a dielectric region 218, such as an aluminum oxide (AlOx) material, a silicon nitride (SiNx) material, another material, or a combination thereof. The MIM capacitor 216 includes a first electrode 220 and a second electrode that includes an upper surface of the conductive loop 210. The dielectric region 218 is disposed between the first electrode 220 and the second electrode.

The glass substrate 102 may further include one or more contacts, such as a contact 224. The contact 224 may adjoin the first electrode 220 of the MIM capacitor 216. The contact 224 may be formed by drilling the polymer material 204 to create a cavity and by filling the cavity with a metal (e.g., copper), as an illustrative example.

Although the example of FIG. 2 depicts that the TGV 214 is positioned above the semiconductor die 106, in other implementations, the MIM capacitor 216 is positioned above the semiconductor die 106. For example, the dielectric region 218 may be formed on or above the semiconductor die 106, and the MIM capacitor 216 may be formed on the dielectric region 218.

One or more aspects of FIG. 2 may improve performance of a device. For example, in an illustrative implementation, "extra" thickness of the glass substrate 102 (as a result of removing circuitry and/or molding from a surface of the glass substrate 102) may be allocated to a 3D inductor formed within the glass substrate 102. The 3D inductor may have a greater quality factor (Q factor) as compared to a planar inductor, yielding improved device performance. Further, in some implementations, the 3D inductor may have a "wrap-around" configuration (e.g., to wrap around the semiconductor die 106) to further increase device packing density, as described further with reference to FIG. 3.

Figure 3:
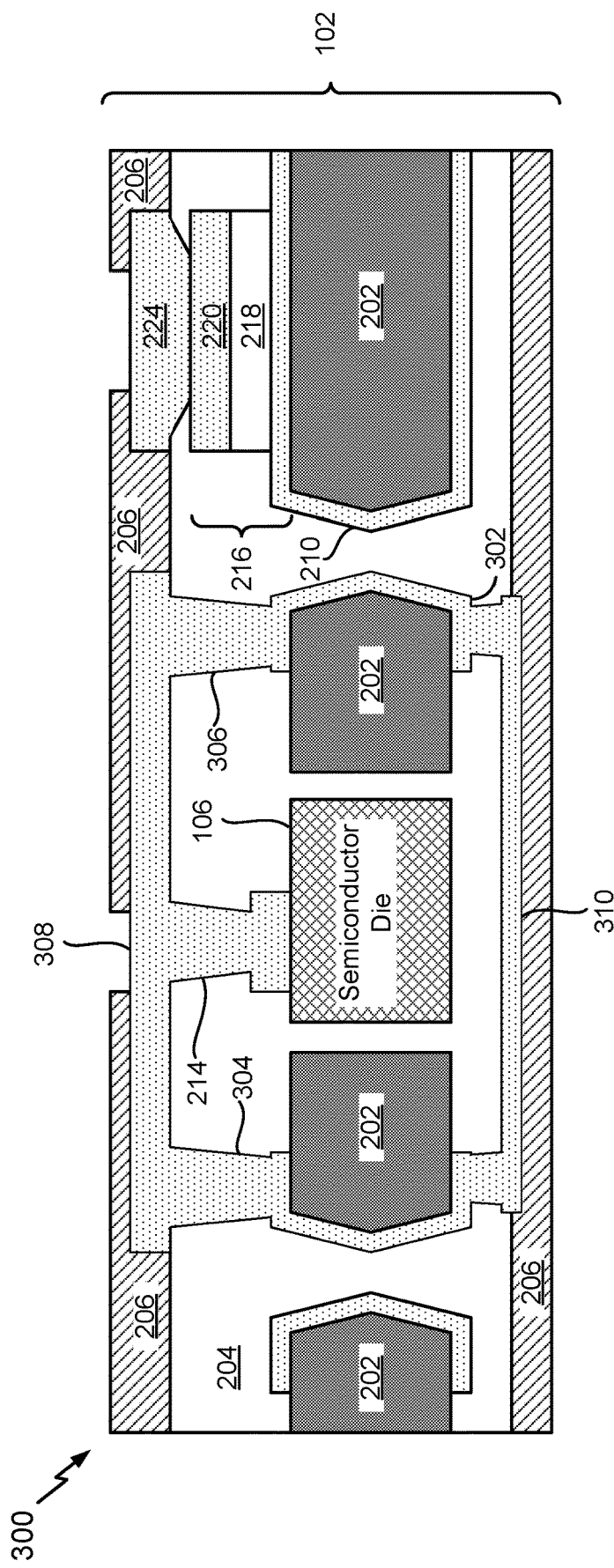
FIG. 3 illustrates a cross-sectional view of another illustrative example of the glass substrate of FIG. 1.

FIG. 3 illustrates a cross section 300 of a second example of the glass substrate 102. In this example, the glass substrate 102 may include a 3D inductor 302 having a wrap-around configuration that at least partially surrounds the semiconductor die 106, which may increase device packing density of a device that includes the glass substrate 102.

The 3D inductor 302 may include one or more TGVs, such as TGVs 304, 306. The 3D inductor 302 may be in contact with the glass material 202 and the polymer material 204. The 3D inductor 302 includes a trace 308 (e.g., a first planar metallic region) disposed at a first side of the semiconductor die 106 and further includes a trace 310 (e.g., a second planar metallic region) disposed at a second side of the semiconductor die 106. Additional illustrative aspects of the 3D inductor 302 are described further with reference to FIG. 4.

Figure 4:
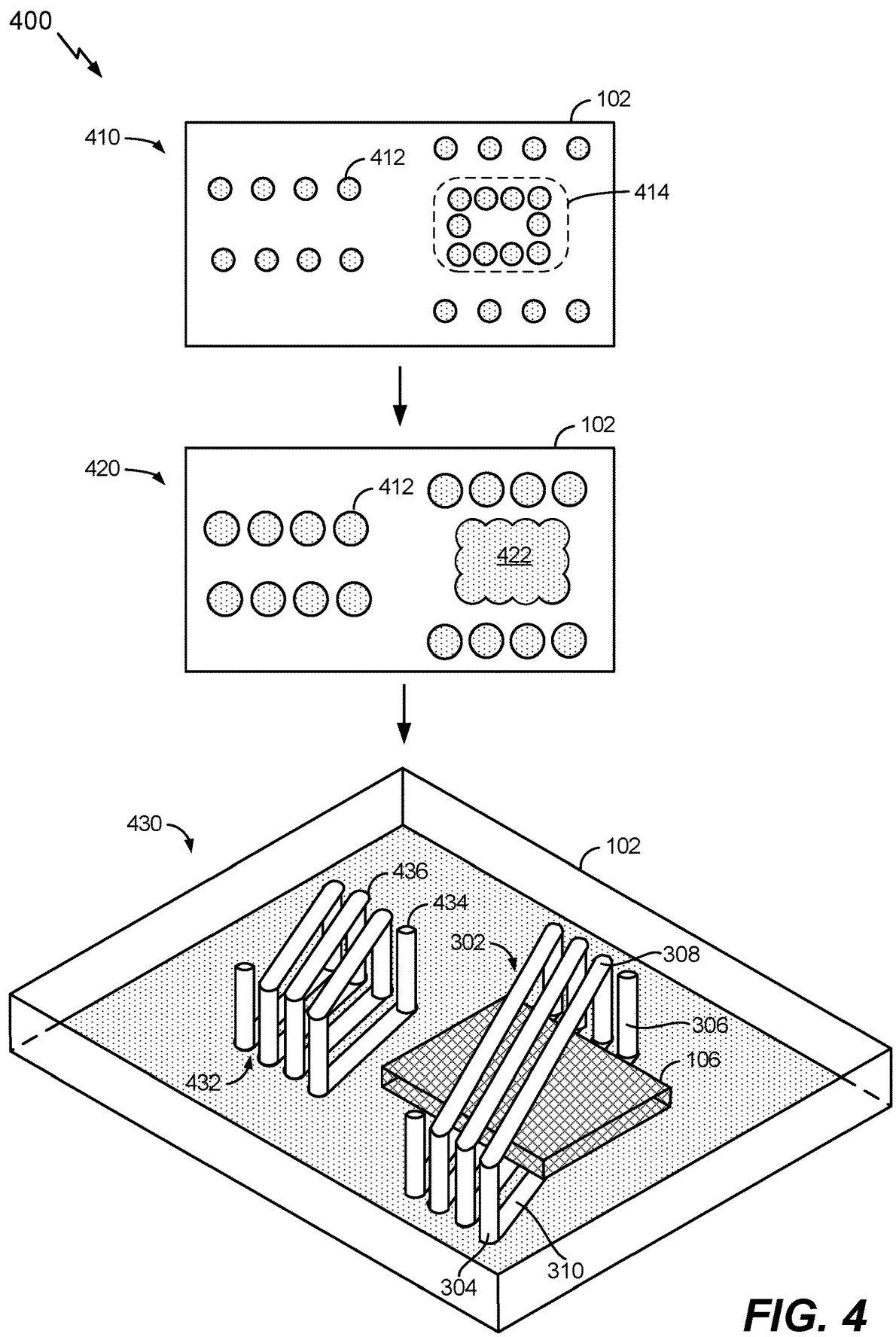
FIG. 4 illustrates an example of a process for forming the glass substrate of FIG. 1.

Referring to FIG. 4, an illustrative example of a process is depicted and generally designated 400. FIG. 4 depicts an overhead view of illustrative aspects of the glass substrate 102 during the process 400, at 410 and at 420. FIG. 4 also depicts a perspective view of illustrative aspects of the glass substrate 102 during the process 400, at 430.

The process 400 includes performing a forming a plurality of holes in the glass substrate 102, at 410. For example, a drilling process may be used to form the plurality of holes, such as a hole 412. The plurality of holes includes a first subset 414 and a second subset that is distinct from the first subset 414. A distance between holes of the first subset 414 may be less than a distance between holes of the second subset (e.g., the first subset 414 may be "packed" more closely as compared to holes of the second subset). The first subset 414 may correspond to a perimeter of a cavity to be formed in the glass substrate 102. The second subset may correspond to a set of TGVs to be formed in the glass substrate 102, such as TGVs of one or more of the inductors 156, 160, and 302.

The process 400 further includes performing an etch process, at 420. In a particular illustrative example, the etch process is a wet etch. In other examples, another etch process may be used, such as a dry etch. Performing the etch process removes material from the glass substrate 102. For example, performing the etch process may enlarge a diameter of one or more holes formed in the glass substrate 102, such as by enlarging a first diameter of the hole 412 to a second diameter (e.g., from approximately 50 microns to approximately 80 microns, as an illustrative example). Removing material from the glass substrate 102 using the etch process may "punch through" the first subset 414 to form a cavity 422.

The process 400 further includes integrating the semiconductor die 106 within the cavity 422 and forming one or more inductors using the second subset of the plurality of holes, at 430. To illustrate, FIG. 4 depicts that holes formed in the glass substrate 102 may be filled to form TGVs of a 3D inductor 432, such as using one or more of a deposition process, a patterning process, or a plating process, as illustrative examples. As a particular illustrative example, the hole 412 may be filled with a copper material to form a TGV 434 of the 3D inductor 432. TGVs of the 3D inductor 432 may be connected using traces, such as a trace 436. The trace 436 may be coupled to one or more device components, such as to the antenna 132, the semiconductor die 106, or another device component. Depending on the particular example, the 3D inductor 432 may correspond to the inductor 156, the inductor 160, an inductor included in the multiband bandpass filter 152, or another inductor.

FIG. 4 also illustrates that the 3D inductor 302 may have a wrap-around configuration that wraps around the semiconductor die 106. To illustrate, the trace 308 may be disposed above a first surface (e.g., a top surface) of the semiconductor die 106, and the trace 310 may be disposed below a second surface (e.g., a bottom surface) of the semiconductor die 106. The TGV 304 may be disposed next to a first side of the semiconductor die 106, and the TGV 306 may be disposed next to a second side of the semiconductor die 106.

In some implementations, a drilling process performed at 410 of FIG. 4 and an etch process performed at 420 of FIG. 4 may correspond to a two-stage process that enables formation of the cavity 422 without use of a special purpose tool or process. For example, the two-stage process may "punch through" the first subset 414 to form the cavity 422 without use of a special purpose mask. As a result, the semiconductor die 106 may be integrated within the glass substrate 102 without use of a special purpose tool or process, thus reducing cost of fabrication of the glass substrate 102.

Figure 5:
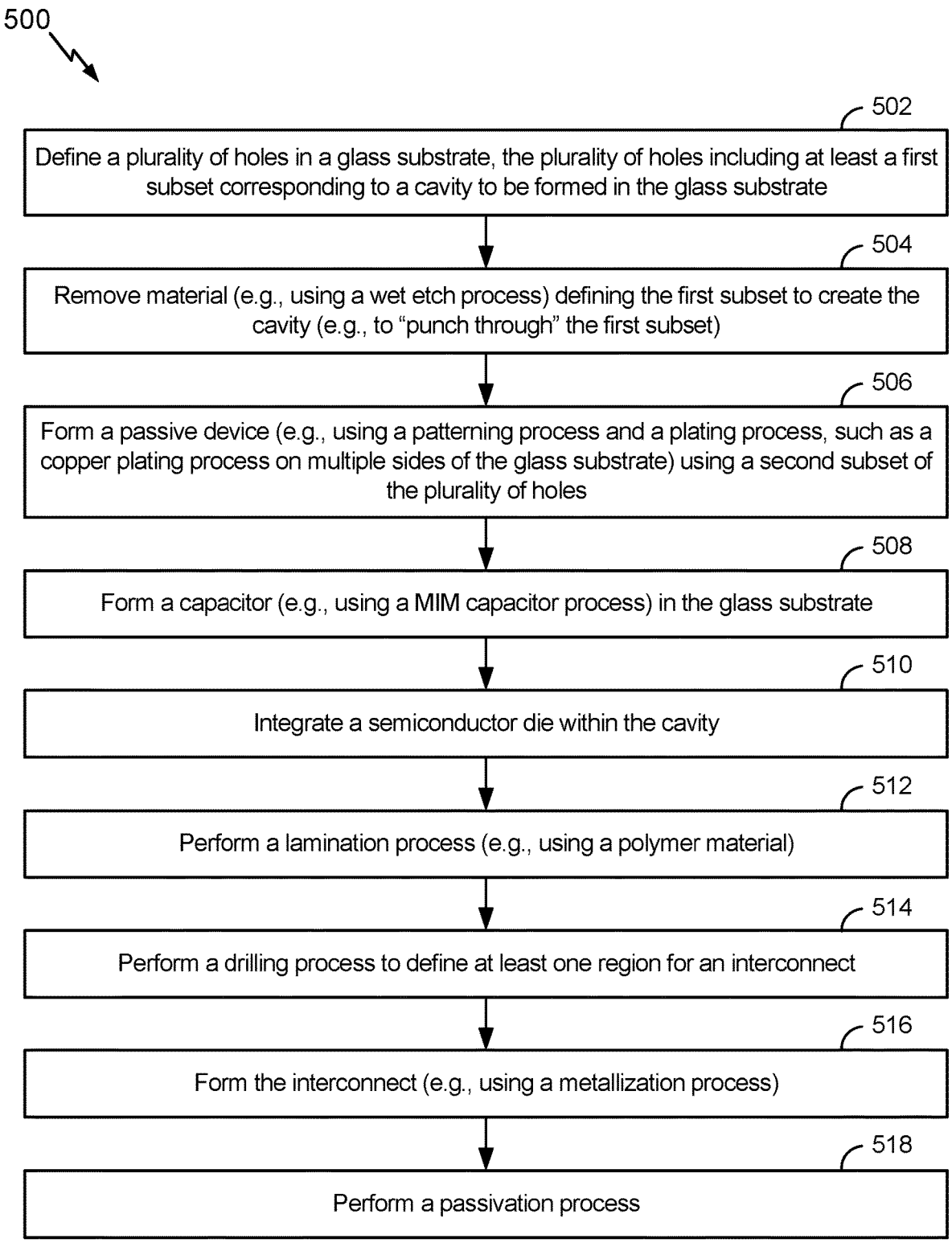
FIG. 5 is a flow chart of an example of a method of forming the glass substrate of FIG. 1.

Referring to FIG. 5, an illustrative method of fabrication of a device is depicted and generally designated 500. The method 500 may be performed during fabrication of the glass substrate 102, as an illustrative example. In some implementations, the method 500 may be performed on a glass panel that includes multiple glass substrates corresponding to the glass substrate 102 (e.g., to create multiple glass substrates corresponding to the glass substrate 102).

The method 500 includes defining a plurality of holes in a glass substrate (e.g., using a drilling process, such as a laser drilling process), at 502. The plurality of holes includes at least a first subset corresponding to a cavity to be formed in the glass substrate. For example, FIG. 4 illustrates that a plurality of holes may be formed in the glass substrate 102. The plurality of holes may include the first subset 414 corresponding to the cavity 422 to be formed in the glass substrate 102.

The method 500 further includes removing material (e.g., using a wet etch process) defining the first subset to define the cavity, at 504. In an illustrative implementation, the material is removed using an etch process, such as a wet etch process. The etch process may "punch" through the first subset 414 to define the cavity 422 and may enlarge diameters of a second subset of the plurality of holes (e.g., by enlarging a diameter of the hole 412, as illustrated at 410 and at 420 in FIG. 4).

The method 500 further includes forming a passive device using a second subset of the plurality of holes, at 506. For example, the passive device may be formed using a patterning process and a plating process, such as a copper plating process. The passive device may include one or more 3D inductors, such as the 3D inductor 302, the 3D inductor 432, another component, or a combination thereof. The plating process may include filling the hole 412 to form the TGV 434. The plating process may also include forming the TGVs 304, 306. The plating process may be performed at multiple sides of the glass substrate 102. For example, the plating process may be performed at a first side (e.g., a bottom side) of the glass substrate 102 to form the trace 310 and may be performed at a second side (e.g., a top side) of the glass substrate 102 to form the traces 308, 436.

The method 500 may include forming a capacitor (e.g., the MIM capacitor 216) in the glass substrate, at 508. As an illustrative example, a MIM capacitor process may be performed to create the dielectric region 218 of FIGS. 2 and 3, such as by depositing and patterning an insulator material on an upper surface of the conductive loop 210. The insulator material may include an AlOx material, a SiNx material, another material, or a combination thereof. The MIM capacitor process may also include forming the first electrode 220 (e.g., by depositing and patterning a copper material).

The method 500 further includes integrating a semiconductor die within the cavity, at 510. For example, the semiconductor die 106 may be inserted in the cavity 422. In some implementations, an adhesive material (e.g., adhesive tape) may be applied to one or more surfaces of the glass substrate 102 that define the cavity 422. For example, an adhesive material may be applied to a bottom surface of the glass substrate 102 (e.g., by applying the adhesive material to mask or "cover" the cavity 422), and the semiconductor die 106 may be positioned in the cavity 422 and connected to the adhesive material.

The method 500 may include performing a lamination process (e.g., using a polymer material), at 512. The lamination process may include applying one or more of a curable material, an organic material, a polymer material, a "pre-preg" material, an epoxy material, or another material to the glass substrate 102. For example, the lamination process may include forming the polymer material 204 (e.g., to enclose or "seal" the semiconductor die 106 within the cavity 422). In an illustrative example, the lamination process is performed at a first surface (e.g., a top surface) of the glass substrate 102 prior to performing the lamination process at a second surface (e.g., a bottom surface) of the glass substrate 102. An adhesive material used to secure the semiconductor die 106 may be removed after lamination of the first surface. After removing the adhesive material, the lamination process may be performed at the second surface (e.g., after rotating the glass substrate 102 to expose the second surface).

The method 500 may include performing a drilling process (e.g., a laser drilling process) to define at least one region for an interconnect, at 514. For example, the drilling process may be applied to form a region for the TGV 214.

The method 500 may include forming the interconnect (e.g., using a metallization process), at 516. For example, the metallization process may include depositing a copper material to form the TGV 214.

The method 500 may include performing a passivation process, at 518. For example, the passivation process may be performed to create the dielectric material 206.

It is noted that certain operations of the method 500 may be performed in a different order than as illustrated in the example of FIG. 5. For example, in some cases, the semiconductor die 106 may be integrated within the cavity 422 prior to forming one or more components of the passive device, at 506, prior to forming the capacitor, at 508, or prior to both. As a particular illustrative example, in a "wrap-around" implementation, the semiconductor die 106 may be integrated within the cavity 422 prior to forming one or both of the traces 308, 310, prior to forming one or both of the TGVs 304, 306, or a combination thereof. As an additional illustrative example, in some implementations, the MIM capacitor 216 may be formed above the semiconductor die 106 after the semiconductor die 106 is integrated within the cavity 422 and after performing the lamination process, at 510 and at 512.

Figure 6:
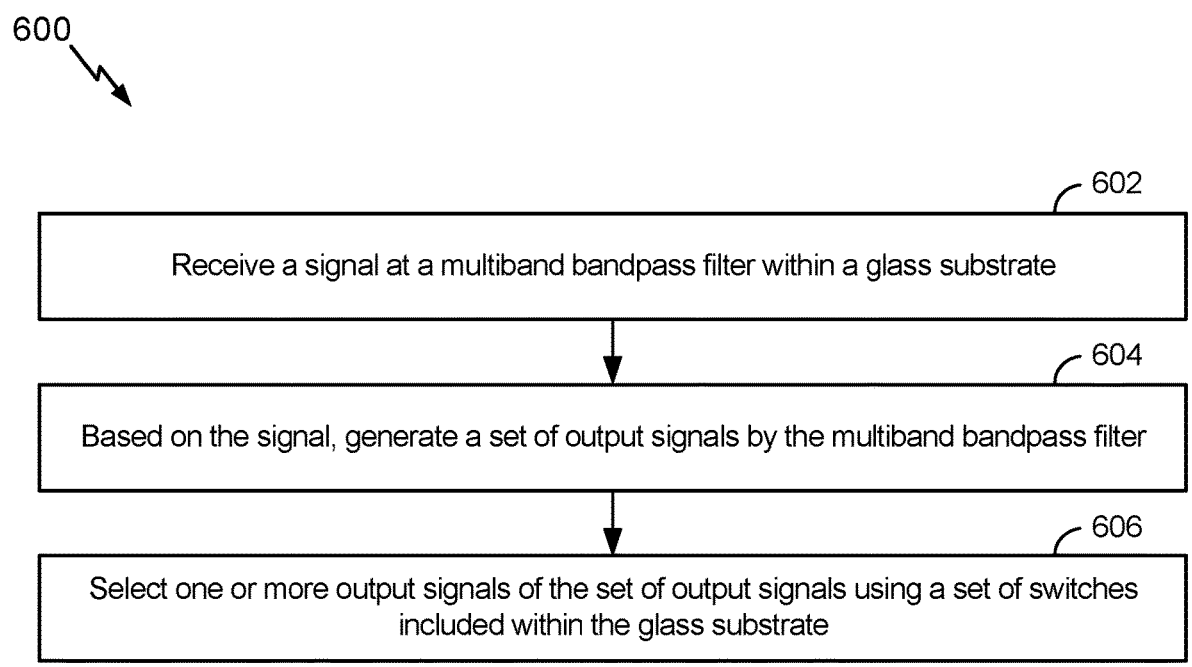
FIG. 6 is a flow chart of an example of a method of operating a device that includes the glass substrate of FIG. 1.

Referring to FIG. 6, an illustrative example of a method is depicted and generally designated 600. The method 600 may be performed during operation of an electronic device that includes the glass substrate 102.

The method 600 includes receiving a signal at a multiband bandpass filter within a glass substrate, at 602. For example, a signal may be received by the multiband bandpass filter 152 from the antenna 132. The multiband bandpass filter 152 is integrated within the glass substrate 102.

The method 600 further includes generating a set of output signals by the multiband bandpass filter based on the signal (e.g., using a multiband pass filtering technique), at 604. For example, the set of output signals may include one or more of the HB signal, the MB signal, or the LB signal.

The method 600 further includes selecting one or more output signals of the set of output signals using a set of switches included within the glass substrate, at 606. For example, the first set of one or more switches 162 may be activated to select the HB signal. As another example, the second set of one or more switches 164 may be activated to select the MB signal.

Figure 7:
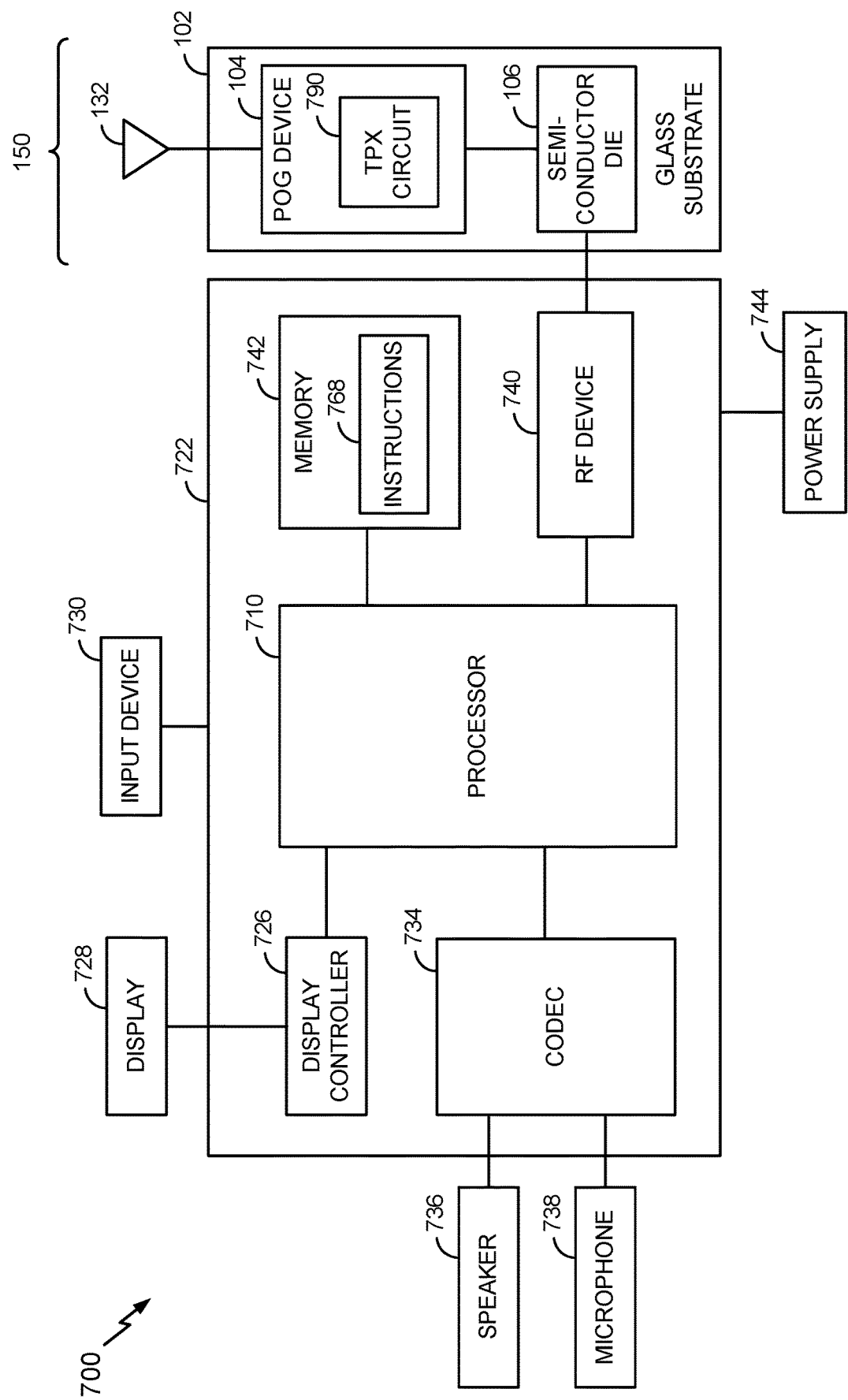
FIG. 7 is a block diagram of an illustrative example of an electronic device that includes the glass substrate of FIG. 1.

Referring to FIG. 7, a block diagram of a particular illustrative example of an electronic device is depicted and generally designated 700. The electronic device 700 may correspond to a mobile device (e.g., a cellular phone), a computer (e.g., a server, a laptop computer, a tablet computer, or a desktop computer), an access point, a base station, a wearable electronic device (e.g., a personal camera, a head-mounted display, or a watch), a vehicle control system or console, an autonomous vehicle (e.g., a robotic car or a drone), a home appliance, a set top box, an entertainment device, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

The electronic device 700 includes one or more processors, such as a processor 710. The processor 710 may include a digital signal processor (DSP), a central processing unit (CPU), a graphics processing unit (GPU), another processing device, or a combination thereof.

The electronic device 700 may further include one or more memories, such as a memory 742. The memory 742 may be coupled to the processor 710. The memory 742 may include random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), one or more registers, a hard disk, a removable disk, a compact disc read-only memory (CD-ROM), another memory device, or a combination thereof.

The memory 742 may store instructions 768. The instructions 768 are executable by the processor 710 to initiate, control, or perform one or more operations, such as operations of the method 600 of FIG. 6.

A coder/decoder (CODEC) 734 can also be coupled to the processor 710. The CODEC 734 may be coupled to one or more microphones, such as a microphone 738. FIG. 7 also shows a display controller 726 that is coupled to the processor 710 and to a display 728. A speaker 736 may be coupled to the CODEC 734.

FIG. 7 also indicates that a radio frequency (RF) device 740 may be coupled to the system 150 of FIG. 1. The RF device 740 may include a transceiver, as an illustrative example. Alternatively or in addition, the RF device 740 may include one or more LNAs coupled to the semiconductor die 106. Alternatively or in addition, the RF device 740 may include a wireless controller configured to selectively activate and deactivate the sets of switches 162, 164. As an illustrative example, the RF device 740 may include a wireless controller configured to selectively activate and deactivate the sets of switches 162, 164 in response to commands from the processor 710 based on a carrier aggregation mode used in a wireless network.

In the example of FIG. 7, the POG device 104 includes a triplexer (TPX) circuit 790. The TPX circuit 790 is an example of a filter that may correspond to the multiband bandpass filter 152 of FIG. 1. In other implementations, the POG device 104 may include another device, such as a diplexer (DPX) circuit or a quadplexer (QPX) circuit, as illustrative examples.

In a particular example, the processor 710, the memory 742, the display controller 726, the CODEC 734, and the RF device 740 are included in a system-on-chip (SoC) device 722. Further, an input device 730 and a power supply 744 may be coupled to the SoC device 722. Moreover, in a particular example, as illustrated in FIG. 7, the system 150, the display 728, the input device 730, the speaker 736, the microphone 738, the antenna 132, and the power supply 744 are external to the SoC device 722. However, each of the system 150, the display 728, the input device 730, the speaker 736, the microphone 738, the antenna 132, and the power supply 744 can be coupled to a component of the SoC device 722, such as to an interface or to a controller.

In some examples, the glass substrate 102 corresponds to a substrate of a package that includes the SoC device 722. In another example, the glass substrate 102 corresponds to an interposer coupled to the SoC device 722 and to one or more other components, such as a printed circuit board (PCB) or another integrated circuit. In another example, the glass substrate 102 corresponds to a substrate of a HIC that includes or that is coupled to the SoC device 722.

Although certain examples have been described with reference to a receiver implementation, aspects of the disclosure may be used in connection with a transmitter implementation (alternatively or in addition to a receiver implementation). To illustrate, in an illustrative example of a transmitter implementation of the RF device 740, the POG device 104 may include a multiplexing device configured to combine multiple signals of different frequencies received from the semiconductor die 106 and to generate an output signal that is transmitted via a wireless network using the antenna 132 (e.g., in accordance with a carrier aggregation technique).

In addition, although three signals have been described with reference to FIG. 1 (the HB signal, the MB signal, and the LB signal), in other implementations, a different number of signals may be used (e.g., one signal, four signals, or another number of signals). To further illustrate, a diplexer (DPX) circuit may be implemented in place of the TPX circuit 790, such as in connection with a two-signal implementation or in connection with a three-signal implementation (e.g., using a dual-stage DPX circuit).

In connection with the described examples, an apparatus includes means for bandpass filtering (e.g., the POG device 104, the multiband bandpass filter 152, or both) a signal (e.g., a signal from the antenna 132). The means for filtering is integrated within a glass substrate, such as the glass substrate 102. The apparatus further includes means (e.g., the semiconductor die 106, the first set of one or more switches 162, the second set of one or more switches 164, or a combination thereof) for selecting one or more output signals of a set of output signals generated by the means for bandpass filtering. The means for selecting is integrated within the glass substrate.

The foregoing disclosed devices and functionalities may be designed and represented using computer files (e.g. RTL, GDSII, GERBER, etc.). The computer files may be stored on computer-readable media. Some or all such files may be provided to fabrication handlers who fabricate devices based on such files. Resulting products include wafers that are then cut into die and packaged into integrated circuits (or "chips"). The chips are then employed in electronic devices, such as the electronic device 700 of FIG. 7.

The various illustrative logical blocks, configurations, modules, circuits, and algorithm steps described in connection with the examples disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

One or more operations of a method or algorithm described herein may be embodied directly in hardware, in a software module executed by a processor, or in a combination of the two. For example, one or more operations of the method 500, the method 600, or both may be initiated, controlled, or performed using a field-programmable gate array (FPGA) device, an application-specific integrated circuit (ASIC), a processing unit such as a central processing unit (CPU), a digital signal processor (DSP), a controller, another hardware device, a firmware device, or a combination thereof. A software module may reside in random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed examples is provided to enable a person skilled in the art to make or use the disclosed examples. Various modifications to these examples will be readily apparent to those skilled in the art, and the principles defined herein may be applied to other examples without departing from the scope of the disclosure. Thus, the present disclosure is not intended to be limited to the examples shown herein but is to be accorded the widest scope possible consistent with the principles and novel features as defined by the following claims.

What is claimed is:

1. An apparatus comprising:
 a passive-on-glass (POG) device integrated within a glass substrate;
 a semiconductor die integrated within the glass substrate; and
 an inductor that has a wrap-around configuration that at least partially surrounds the semiconductor die.

2. The apparatus of claim 1, further comprising a metal-insulator-metal (MIM) capacitor included in the POG device.

3. The apparatus of claim 1, wherein the inductor is a three-dimensional inductor.

4. The apparatus of claim 1, further comprising a triplexer (TPX) circuit included in the POG device.

5. The apparatus of claim 1, further comprising one or more through-glass vias (TGVs) included in the POG device.

6. The apparatus of claim 1, further comprising a port configured to receive a signal from an antenna and to provide the signal to the POG device.

7. The apparatus of claim 6, wherein the semiconductor die includes a set of switches configured to select one or more of a set of output signals generated by the POG device in response to the signal.

8. A method of fabrication of a device, the method comprising:
 forming a cavity in a glass substrate;

integrating a passive device at least partially within the glass substrate; and integrating a semiconductor die within the cavity, wherein the passive device has a wrap-around configuration that at least partially surrounds the semiconductor die.

9. The method of claim 8, further comprising defining a plurality of holes in the glass substrate.

10. The method of claim 9, wherein forming the cavity includes performing an etch process to remove material defining at least a first subset of the plurality of holes to form the cavity.

11. The method of claim 10, wherein the passive device includes a three-dimensional (3D) inductor formed within the cavity.

12. The method of claim 11, wherein forming the passive device includes performing a copper plating process to form the inductor.

13. The method of claim 12, wherein performing the copper plating process includes forming one or more through-glass vias (TGVs) by depositing copper material, forming one or more traces by depositing copper material, or a combination thereof.

14. The method of claim 12, wherein the copper plating process is applied to a top side and to a bottom side of the glass substrate.

15. The method of claim 8, further comprising performing a metal-insulator-metal (MIM) process to form a capacitor of the glass substrate.

16. A computer-readable medium storing instructions executable by a processor to initiate, control, or perform operations comprising:

forming a cavity in a glass substrate;

integrating a passive device at least partially within the glass substrate and integrating a semiconductor die within the cavity, wherein the passive device has a wrap-around configuration that at least partially surrounds the semiconductor die.

17. The computer-readable medium of claim 16, wherein the operations further comprise performing a copper plating process to form an inductor of the passive device.

18. The computer-readable medium of claim 17, wherein the inductor is formed at least partially around the semiconductor die.

19. The computer-readable medium of claim 16, wherein the passive device includes an inductor having a three-dimensional (3D) wrap-around configuration.

20. The computer-readable medium of claim 16, wherein the semiconductor die includes a plurality of switches, and wherein the passive device includes an inductor that at least partially surrounds the plurality of switches.

* * * * *